United States Patent [19]

Ullrich et al.

[11] Patent Number: 4,734,597

[45] Date of Patent: Mar. 29, 1988

[54] CMOS INVERTER CHAIN

[75] Inventors: Manfred F. Ullrich, Denzlingen; Arnold Uhlenhoff, Emmendingen, both of Fed. Rep. of Germany

[73] Assignee: Intermetall, Division of Ditti, Freiburg, Fed. Rep. of Germany

[21] Appl. No.: 938,632

[22] Filed: Dec. 5, 1986

[30] Foreign Application Priority Data

Dec. 7, 1985 [EP] European Pat. Off. ........ 85115598.6
Feb. 27, 1986 [EP] European Pat. Off. ........ 86102586.4

[51] Int. Cl.⁴ .................. H03K 19/20; H03K 19/096; H03K 19/017
[52] U.S. Cl. .................................... 307/481; 307/452; 377/79; 377/121; 377/105
[58] Field of Search ............... 307/452, 481, 448, 453, 307/304, 234, 450; 377/74, 79, 121, 105

[56] References Cited

U.S. PATENT DOCUMENTS

| | | | | |
|---|---|---|---|---|
| 4,040,015 | 8/1977 | Fukuda | ........................... | 307/481 |
| 4,057,741 | 11/1977 | Piguet | ........................... | 377/79 |
| 4,250,406 | 2/1981 | Alaspa | ........................... | 307/481 |
| 4,567,386 | 1/1986 | Benschop | ........................... | 377/79 |

FOREIGN PATENT DOCUMENTS 2327733 12/1973 Fed. Rep. of Germany .
2450882 10/1975 Fed. Rep. of Germany .
2541255 3/1976 Fed. Rep. of Germany .

Primary Examiner—Stanley D. Miller
Assistant Examiner—Timothy P. Callahan
Attorney, Agent, or Firm—T. L. Peterson

[57] ABSTRACT

A CMOS inverter chain includes the alternating series connection of N- and P-inverters. An N-inverter is a conventional type of CMOS inverter employing an N-intermediate transistor between both the P- and the N-transistor; a P-inverter, however, is a CMOS inverter employing a P-intermediate transistor between both the P- and the N-transistor. The gates of the intermediate transistors are interconnected and controlled by the clock signal, whereas the inverter input is constituted by the interconnected gates of the P- and the N-transistor of each inverter. Such an inverter chain can be used, for example, as a digital pulse width discriminator, as a final position counter, as a circuit for compensating signal drop-outs in input pulses, or else for effecting ring oscillator synchronizations.

6 Claims, 6 Drawing Figures

CMOS INVERTER CHAIN

BACKGROUND OF THE INVENTION

The invention pertains to a CMOS inverter chain with at least two N- or P-inverters which, in terms of signal flow, are disposed alternatingly in series, with the controlled current path lying between the poles of a source of DC voltage.

One such CMOS inverter chain comprising a single N-inverter and a single P-inverter which, in terms of signal flow, is in series with the N-inverter, is described in the German Offenlegungsschrift DE No. 24 50 882 A1, especially in connection with FIG. 7 thereof. Relative thereto, the respective signal input is the gate of the N-or P-intermediate transistor, while the gates of both the N- and the P-transistors which are connected in the known manner, in the case of the N-inverter, are fed with a clock signal and, in the case of the P-inverter, with a clock signal which is inverse in relation thereto. The purpose of this two-stage CMOS inverter chain is to make sure that the two nominal binary-signal levels will appear at the output of the P-inverter. Both the N-and the P-intermediate transistors merely represent the most simple case of a logic gate which, instead of them, can be inserted into the conventional type of CMOS inverter. Thus, in this arrangement it is possible, cf. FIG. 11, to dispose several logic CMOS gates in series, in terms of signalflow, and to operate them dynamically.

SUMMARY OF THE INVENTION

In contradistinction to the foregoing, the invention is not, in terms of signal flow, aimed at effecting a series arrangement of dynamic CMOS gates, but has for its object to provide a CMSO inverter chain having novel properties. Because when the arrangement referred to hereinbefore is modified in accordance with the invention, that is, when only one single clock signal is applied to the interconnected gates of all intermediate transistors, and when at the same time the interconnected gates of the N- and P-transistors of each inverter are used in the known manner as signal inputs, it is possible, for example, for the CMOS inverter chain according to the invention to be used either as a digital pulse width discriminator, as a pulse drop-out compensation circuit, or as a reset - type final position counter, e.g., in a circuit for synchronizing (CMOS) ring oscillators.

A CMOS inverter chain includes the alternating series connection of N- and P-inverters. An N-inverter is a conventional type of CMOS inverter employing an N-intermediate transistor between both the P- and the N-transistor; a P-inverter, however, is a CMOS inverter employing a P-intermediate transistor between both the P-and the N-transistor. The gates of the intermediate transistors are interconnected and controlled by the clock signal, whereas the inverter input is constituted by the interconnected gates of the P- and the N-transistor of each inverter.

BRIEF DESCRIPTION OF THE DRAWINGS

The invention will be better understood from a reading of the following detailed description in conjunction with the drawing in which.

DETAILED DESCRIPTION

It should be noted that in another German Offenlegungsschrift, i.e., De No. 23 27 733 A1, and more particularly in connection with FIG. 2g thereof, there is described one single CMOS inverter employing an intermediate transistor to the gate of which a clock signal is applied. This inverter, however, forms part of the series selection circuit of a dynamic memory with random access, and is not the first inverter of an inverter chain.

Figure 1:
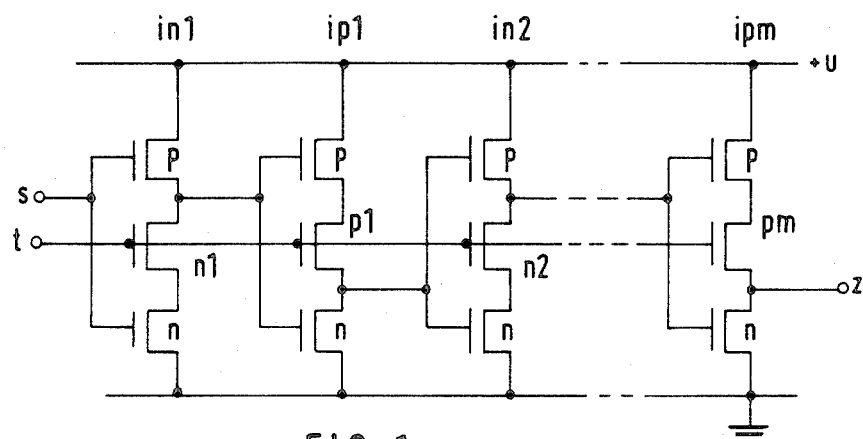
FIG. 1 is a basic circuit diagram of a CMOS inverter chain according to the invention.

Referring now to the circuit diagram of FIG. 1 four inverters of an assumed 2m-membered inverter chain are shown, i.e., N-inverters in1, in2 and P-inverters ip1, ipm. As used herein, the terms P-transistor and N-transistor refer to a P-channel transistor and an N-channel transistor, respectively. Common to all inverters is the respective P-transistor, which, with the one end of its controlled current path, is applied to the positive pole of the source of direct voltage u, and the respective N-transistor which, with the one end of its controlled current path, is applied to the zero or ground point of the circuit. In each of the inverters the gate of the P-transistor is connected to the gate of the N-transistor and, in the manner known per se, represents the signal input, so that the input signal s is to applied to the interconnected gates of the N-inverter in1.

In each N- or P-inverter, between the P- and the N-transistor, there is inserted the controlled curret path of the N-intermediate transistor n1, n2 or of the P-intermediate transistor p1, pm, respectively, so that in each inverter the controlled current paths of the three transistors are arranged in series between the poles of the source of direct voltage u. In each inverter the signal output s the respective current-path connecting point between the P-transistor and the N-intermediate transistor n1 or n2 or between the N-transistor and P-intermediate transistor p1 or p2, respectively. Within the inverter chain, these outputs are in connection with the interconnected gates of the P- and N-transistors of the subsequently following inverter, so that accordingly an N-inverter is always followed by an P-inverter and then again by an N-inverter, and so on. The output signal z appears at the output of the last P-inverter ipm.

The inverter chain according to the invention will be seen to have the following novel properties:

When a pulse-shaped input signal s is fed to the chain's input, the one pulse edge as controlled by the clock signal, passes through the chain and, after m clock-pulse periods identical to the total delay time of the chain, can be taken off as the corresponding pulse edge at the chain's output. The edge directed in opposition to this pulse edge, however, and independently of the clock signal, passes through the inverter chains so quickly that it appears at the chain's output already at a much earlier time position which, in fact, corresponds to the 2m-times purely inverter-design-specific delay time, hereinafter referred to as the inherent delay time of the inverter chain. If the aforementioned first edge has not yet arrived at the inverter output at this particular time position it will, so to speak, be overtaken by the aforementioned second edge, and erased in the course of this.

At first sight this property of the inverter chain according to the invention seems disadvantageous, because only pulses with a pulse width greater than the aforementioned n clock-pulse periods are capable of passing through the chain. According to a preferred practical application of the invention, however, this property can be used for the digital determination of the pulse widths of pulses, that is, in the case of pulse widths below a predetermined pulse-width threshold, to produce the one of two binary-signal levels H, L and, in the case of pulse widths which exceed this threshold, to produce the respective other binary-signal level. The pulse-width threshold is the difference between the aforementioned total delay time and the likewise aforementioned inherent delay time.

Figure 2:
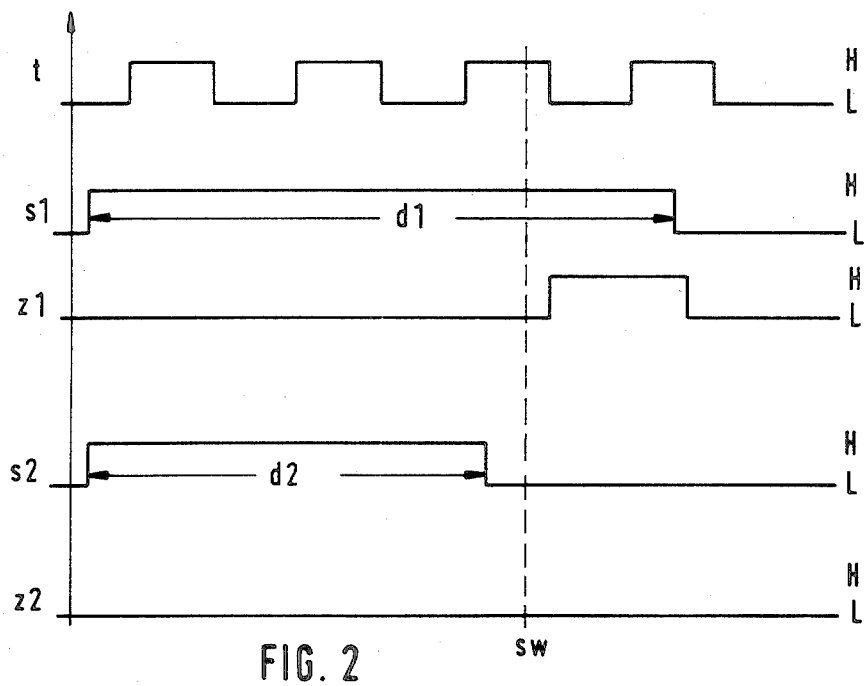
FIG. 2 shows different pulse shapes which appear in the arrangement shown in FIG. 1 during operation.

This is illustrated in detail by the pulse diagrams and signal waveforms of FIG. 2. There are shown some pulses of the clock signal t. When a first input signal whose width d1 is greater than the pulse-width threshold sw is applied to input terminal s there will result a first output signal z1 at terminal z. When the signal applied to terminal s corresponds to signal s2 which has a pulse width d2 which is shorter (smaller) than the pulse-width threshold sw, a second output signal z2 which merely appears a permanent L-level is present at output z.

The above-mentioned novel property of the CMOS inverter chain of the present invention, in accordance with another preferred practical application of the invention, can also be used to compensate for signal drop-outs of input signals whose pulse widths are greater than or exceed the aforementioned difference, hence are greater than the likewise aforementioned pulse-width threshold value sw, in cases where the signal drop-out time is shorter than this threshold. In this particular case the one edge passes unclocked and at a maximum speed through the chain; the opposite edge as unwantedly caused by a short signal drop-out, passes through the chain in a clocked manner, but does not reach the end thereof, because of being erased by the other edge already prior to reaching the chain's end.

If, as is illustrated in FIG. 1, the CMOS inverter chain starts with an N-inverter, then the rising or L/H edge of a pulse as controlled by the clock signal, is shifted within the chain. In cases where the chain starts with a P-inverter it is the following or H/L-edge which become subject to the clock-pulse control.

Figure 3:
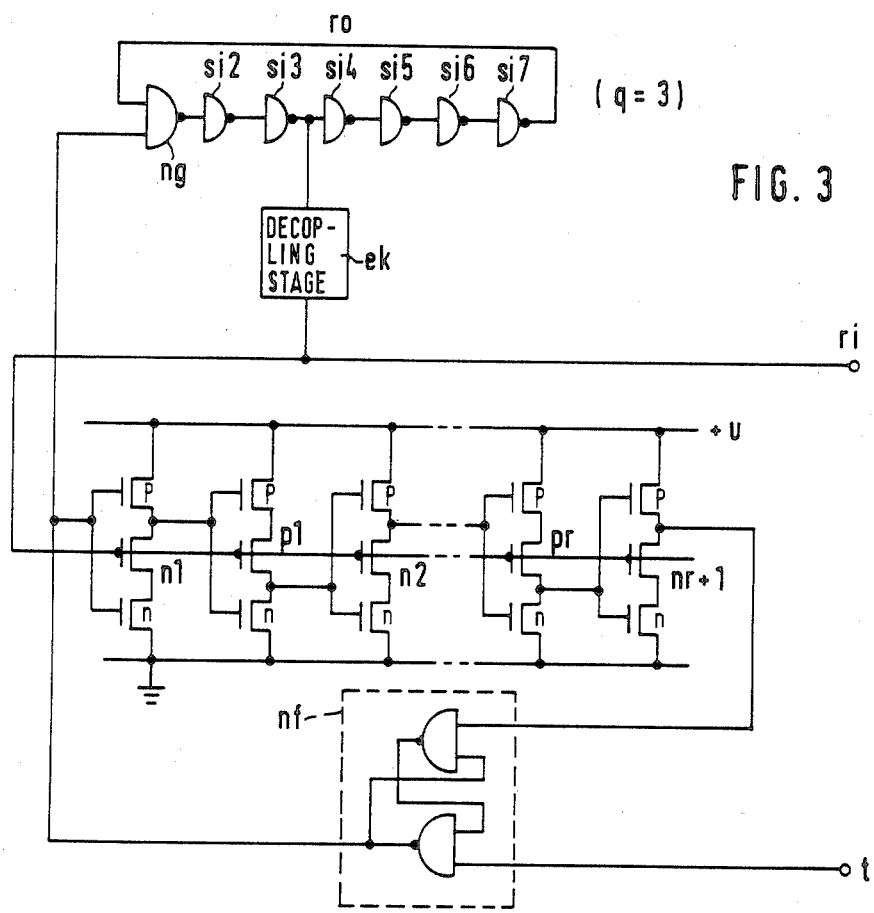
FIG. 3 is a circuit diagram of an embodiment for producing r pulses of a ring oscillator during the period of the clock signal, by employing a CMOS inverter chain of the type as shown in FIG. 1.
Figure 5:
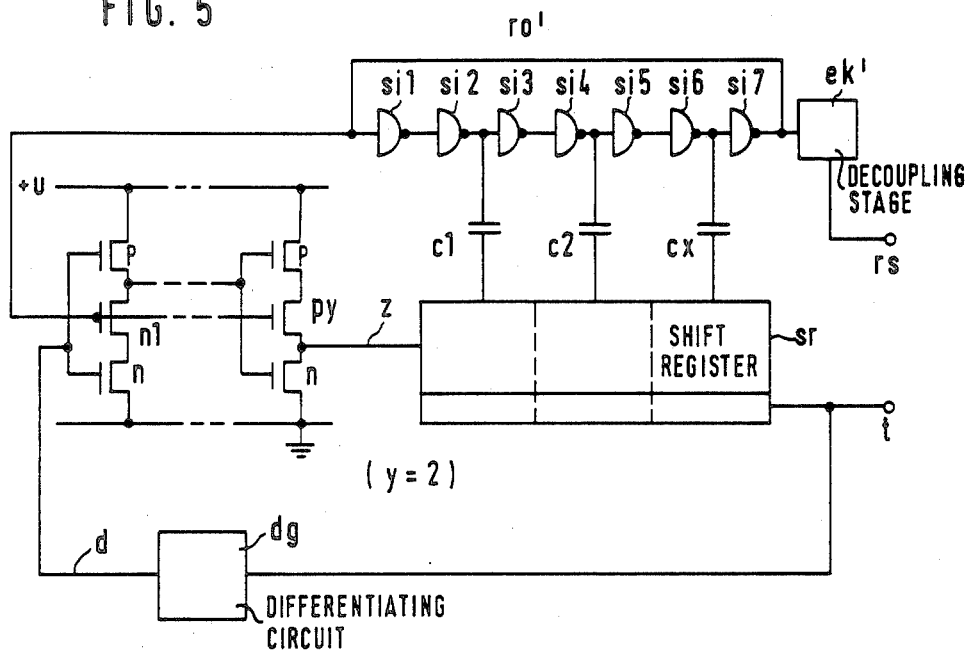
FIG. 5 is a circuit diagram of one embodiment for synchronizing a ring oscillator by employing a CMOS inverter chain of the type as shown in FIG. 1.

FIG. 3 shows the circuit of embodiment for producing r pulses ri of the ring oscillator ro during the period of the clock signal t by employing a CMOS inverter chain of the type as shown in FIG. 1. Relative thereto, the inverter chain, as well as the one used in the circuit of FIG. 5, is used as a reset - type final position counter which, upon reaching a count (counter reading) which has been predetermined by the "length" (number of steps) of the inverter chain, transmits an output pulse.

In this circuit the inverter chain consists of 2r+1 inverters n1, p1, n2 . . . pr, nr+1. The ring oscillator ro consists of an odd number 2q+1 of CMOS standard inverters which, in terms of signal flow, are connected in series and fed back from the output of the last one to the input of the first one, with the first standard inverter, in FIG. 3, being replaced by the NAND gate ng. In FIG. 3, purely by way of example, the ring oscillator ro is shown as such and which, in accordance with the variable number q being equal to 3, has seven steps or stages, i.e., NAND gate ng, and the standard inverters si2, si3, si4, si5, si6, si7. The output of the last standard inverter si7 is connected to one of the two inputs of the NAND gate ng.

For the CMOS standard inverter a conventional type of inverter is used consisting of an N-channel and of a P-channel enhancement type insulated-gate field-effect transistor whose controlled current paths are connected in series and disposed between the two poles of the source of operating voltage, with the interconnected gates thereof forming the signal input, and with the point connecting the current paths thereof forming the signal output.

The output signal of the ring oscillator ro is taken off at the output of the q-th standard inverter si3 via decoupling stage ek and is fed to the clock-pulse input of the inverter chain. The decoupling stage ek may consist, for example, of a number of further series-connected CMOS standard inverters, so that the partial circuits as connected to the output of the decoupling stage ek are prevented from influencing the oscillating frequency of the ring oscillator ro in an unwanted manner.

The clock signal t is applied to the first input of the flip-flop nf consisting of two further NAND gates, which is hereinafter referred to as the NAND flip-flop. The signal output of the last inverter nr+1 of the inverter chain is connected to the second input of the NAND flip-flop nf, with the output thereof being connected to the signal input of the inverter chain.

Figure 4:
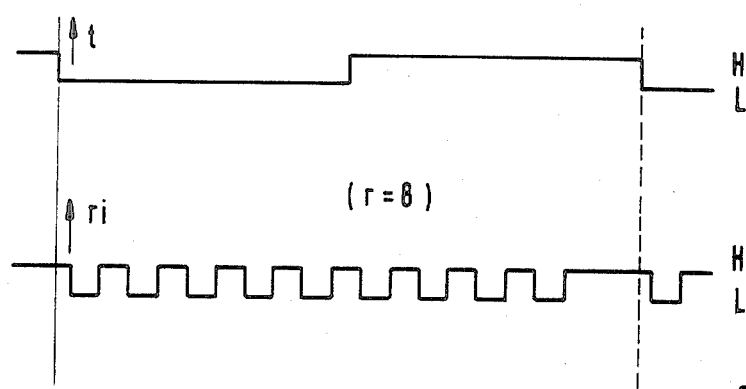
FIG. 4 is a pulse diagram for the circuit of FIG. 3.

FIG. 4 shows signal waveforms for clock signal t and output signal ri. With regard to FIG. 4 it is assumed that eight pulses ri are supposed to be produced within the period of the clock signal t, so that accordingly r=8 applies. As is indicated by the no-pulse period toward the right-hand end of the waveform shown in FIG. 4, by correspondingly dimensioning the frequency of the clock signal t with a view to the frequency of the ring oscillator ro and the number r of the pulses to be produced, the frequency of the ring ooscillator ro is likely to vary during operation. Therefore, the frequency of the clock signal t is always chosen to be greater than r-times the ring oscillator frequency, so that the r pulses can be reliably produced under all intended operating conditions.

In the arrangement of FIG. 3 the CMOS inverter chain according to the invention is operated in such a way that the clock signal t is the signal which passes through the inverter chain, while the signal of the ring oscillator ro serves as the clock signal thereof. In addition, because NAND flip-flop nf is an RS flip-flop comprising one S-input (=first input), one R-input (=second input), and one Q-output, the mode of operation corresponding to the signal waveforms as shown in FIG. 4 will result.

In the circuit of FIG. 5 the CMOS inverter chain serves to synchronize a ring oscillator ro' which consists of an odd number 2x+1 of CMOS standard inverters si1 . . . si7 which, in terms of signal flow, are connected in series and fed back from the output of the last to the input of the first inverter, in such a way that, during one clock-signal period, on the average y ring-oscillator pulses rs occur. In this preferred embodiment the inverter chain consists of an even number of 2y inverters n1 ... py. The output of the last standard inverter si7 of the ring oscillator ro' is applied to the clock-pulse input of the inverter chain and, via the decoupling stage ek, to the signal output. The output of the inverter chain is applied to the series input of the x-stage shift register sr whose clock-pulse input is supplied with the clock signal t. The signal input of the inverter chain is supplied with the clock signal t via the differentiating circuit dg. Each output of an even-numbered standard inverter si2, si4, si6, via a capacitor c1, c2, cx, is connected to the respective stage output of the shift register sr.

Figure 6:
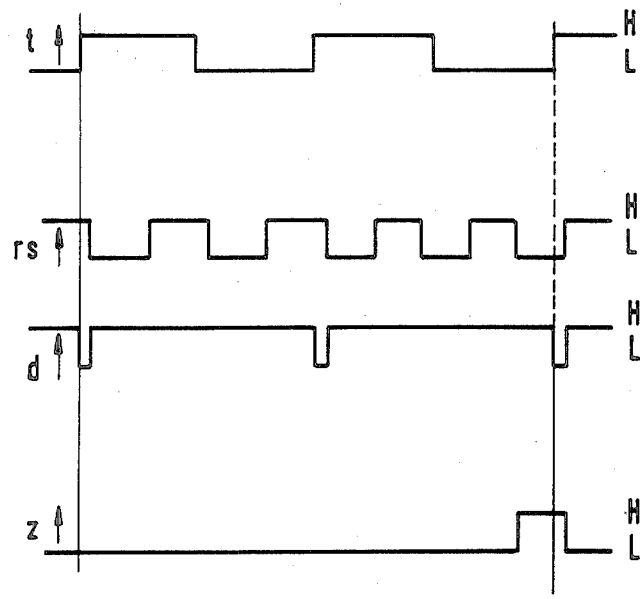
FIG. 6 is a pulse diagram relating to the circuit of FIG. 5.

FIG. 6 shows the waveforms of the clock signal t, ring-oscillator pulses rs, output signal d of the differentiating circuit dg, and the output signal z of the inverter chain, i.e., with respect to the case where y=2.

As is clearly evident from the waveform rs, the duration of the individual ring-oscillator pulses varies during the clock-signal period. This is achieved by connecting and disconnecting the capacitors c1 ... cx to and from the outputs of the even-numbered standard inverters si2, si4, si6, respectively. This has a regulating effect upon the frequency of the ring oscillator ro with respect to the frequency of the clock signal t and, consequently, causes a synchronization which, in this particular case, may be referred to as a sliding synchronization during respectively y clock-signal periods.

It is thus evident without further ado that the CMOS inverter chain according to the invention as well as the additional circuits as shown in FIGS. 3 and 5 are well suited for being realized in the form of a monolithic integrated semi-conductor circuit.

What is claimed is:

1. A CMOS inverter chain comprising:
   a plurality of inverters disposed in series in terms of signal flow;
   each alternate one of said plurality of inverters being an N-inverter, each N-inverter being a CMOS inverter comprising: a first N-transistor, a first P-transistor, and an intermediate N-transistor, said intermediate N-transistor being in series with the controlled current paths of said first N- and P-transistors, an output terminal coupled to a node connecting said first P-transistor and said intermediate N-transistor, and an input terminal coupled to the gates of said first N-transistor and said first P-transistor;
   each intermediate one of said plurality of inverters being a P-inverter, each P-inverter being a CMOS inverter comprising: a second N-transistor, a second P-transistor, and an intermediate P-transistor, said intermediate P-transistors being in series with the controlled current paths and said second N- and P-transistors, an output terminal coupled to a node connecting said second N-transistor and said intermediate P-transistor, and an input terminal coupled to the gates of said second N- and P-transistors;
   a clock terminal coupled to the gates of all of said intermediate N- and P-transistors for applying clock signals thereto; and wherein
   the input terminal of each of said inverters except the first one of said inverters is connected to the output terminal of the preceding one of said inverters.

2. A digital pulse width discriminator, said discriminator comprising:
   a plurality of inverters disposed in series in terms of signal flow;
   each alternate one of said plurality of inverters being an N-inverter, each N-inverter being a CMOS inverter comprising: a first N-transistor, a first P-transistor, and an intermediate N-transistor, said intermediate N-transistor being in series with the controlled current paths of said first N- and P-transistors, an output terminal coupled to a node connecting said first P-transistor and said intermediate N-transistor, and an input terminal coupled to the gates of said first N-transistor and said first P-transistor;
   each intermediate one of said plurality of inverters being a P-inverter, each P-inverter being a CMOS inverter comprising: a second N-transistor, a second P-transistor, and an intermediate P-transistor, said intermediate P-transistors being in series with the controlled current paths and said second N- and P-transistors, an output terminal coupled to a node connecting said second N-transistor and said intermediate P-transistor, and an input terminal coupled to the gates of said second N- and P-transistors;
   a clock terminal coupled to the gates of all of said intermediate N- and P-transistors for applying clock signals thereto; and wherein
   the input terminal of each of said inverters except the first one of said inverters is connected to the output terminal of the preceding one of said inverters;
   said plurality of inverters having an inherent delay time and a total delay time;
   a discriminator input terminal coupled to the input terminal of a first inverter of said plurality of inverters;
   a discriminator output terminal coupled to the output terminal of a last inverter of said plurality of inverters;
   said discriminator providing an output pulse at said discriminator output terminal in response to an input pulse at said discriminator input terminal having a pulse width exeeding the difference between said total delay time and said inherent delay time.

3. A circuit arrangement for compensating first signal drop-outs, said circuit comprising;
   a plurality of inverters disposed in series in terms of signal flow;
   each alternate one of said plurality of inverters being an N-inverter, each N-inverter being a CMOS inverter comprising: a first N-transistor, a first P-transistor, and an intermediate N-transistor, said intermediate N-transistor being in series with the controlled current paths of said first N- and P-transistors, an output terminal coupled to a node connecting said first P-transistor and said intermediate N-transistor, and an input terminal coupled to the gates of said first N-transistor and said first P-transistor;
   each intermediate one of said plurality of inverters being a P-inverter, each P-inverter being a CMOS inverter comprising: a second N-transistor, a second P-transistor, and an intermediate P-transistor, said intermediate P-transistor being in series with the controlled current paths and said second N- and P-transistors, an output terminal coupled to a mode connecting said second N-transistor and said intermediate P-transistor, and an input terminal coupled to the gates of said second N- and P-transistors;

a clock terminal coupled to the gates of all of said intermediate N- and P-transistors for applying clock signals thereto; and wherein the input terminal of each of said inverters except the first one of said inverters is connected to the output terminal of the preceding one of said inverters;

a circuit input terminal coupled to the input terminal of a first inverter of said plurality of inverters;

a circuit output terminal coupled to the output terminal of a second inverter of said plurality of inverters;

said plurality of inverters having an inherent delay time and a total delay time;

said circuit compensating for signal drop-outs occurring during input pulses having pulse widths exceeding the difference between said total and said inherent delay times where the signal drop-out time is shorter than said difference.

4. A set-back type final position counter, comprising:

a plurality of inverters disposed in series in terms of signal flow;

each alternate one of said plurality of inverters being an N-inverter, each N-inverter being a CMOS inverter comprising: a first N-transistor, a first P-transistor, and an intermediate N-transistor, said intermediate N-transistor being in series with the controlled current paths of said first N- and P-transistors, an output terminal coupled to a node connecting said first P-transistor and said intermediate N-transistor, and an input terminal coupled to the gates of said N-transistor and said first P-transistor;

each intermediate one of said plurality of inverters being a P-inverter, each P-inverter being a CMOS inverter comprising: a second N-transistor, a second P-transistor, and an intermediate P-transistor, said intermediate P-transistors being in series with the controlled current paths and said second N- and P-transistors, an output terminal coupled to a mode connecting said second N-transistor and said intermediate P-transistor, and an input terminal coupled to the gates of said second N- and P-transistors;

a clock terminal coupled to the gates of all of said intermediate N- and P-transistors for applying clock signals thereto; and wherein the input terminal of each of said inverters except the first one of said inverter is connected to the output terminal of the preceding one of said inverters;

a counter input terminal coupled to the input terminal of a first inverter of said plurality of inverters;

a counter output terminal coupled to the output terminal of a last inverter of said plurality of inverters;

said counter providing an output pulse at said counter output terminal in response to a number of input pulses at said counter input terminal said number being predetermined by the number of said plurality of inverters.

5. In combination:

a ring oscillator comprising an odd number of stages which in terms of signal flow are connected in series, the first one of stages comprising a two input NAND gates; the remaining stages comprising a plurality of standard CMOS inverters, the output of the last one of said standard inverters being coupled to one input of said NAND gate;

a plurality of inverters disposed in series in terms of signal flow;

each alternate one of said plurality of inverters being an N-inverter, each N-inverter being a CMOS inverter comprising: a first N-transistor, a first P-transistor, and an intermediate N-transistor, said intermediate N-transistor being in series with the controlled current paths of said first N- and P-transistors, an output terminal coupled to a node connecting said first P-transistor and said intermediate N-transistor, and an input terminal coupled to the gates of said first N-transistor and said first P-transistor;

each intermediate one of said plurality of inverters being a P-inverter, each P-inverter being a CMOS inverter comprising: a second N-transistor, a second P-transistor, and an intermediate P-transistor, said intermediate P-transistors being in series with the controlled current paths and said second N- and P-transistors, an output terminal coupled to a node connecting said second N-transistor and said intermediate P-transistor, and an input terminal coupled to the gates of said second N- and P-transistors;

a clock terminal coupled to the gates of all of said intermediate N- and P-transistors for applying clock signals thereto; and wherein the input terminal of each of said inverters except the first one of said inverters is connected to the output terminal of the preceding one of said inverters;

a decoupling stage coupling the output of said ring oscillator to said clock terminal;

a flip-flop having a first input coupled to the output terminal of the last one of said inverters, a second input receiving clock signals and an output coupled to said NAND gate second input and the input terminal of said first inverter.

6. In combination:

a ring oscillator comprising an odd number of $2x+1$ CMOS standard inverters which in terms of signal flow are connected in series and fed back from the output of the last one of said standard inverters to the input of the first one of said standard inverters; and a CMOS inverter chain for synchronizing said ring oscillator such that during one clock signal period an average of y ring oscillator pulses occur;

said CMOS inverter chain comprising a plurality 2y of inverters disposed in series in terms of signal flow;

each alternate one of said plurality of inverters being an N-inverter, each N-inverter being a CMOS inverter comprising: a first N-transistor, a first P-transistor, and an intermediate N-transistor, said intermediate N-transistor being in series with the controlled current paths of said first N- and P-transistors, an output terminal coupled to a node connecting said first P-transistor and said intermediate N-transistor, and an input terminal coupled to the gates of said first N-transistor and said first P-transistor;

each intermediate one of said plurality of inverters being a P-inverter, each P-inverter being a CMOS inverter comprising: a second N-transistor, a second P-transistor, and an intermediate P-transistor, said intermediate P-transistors being in series with the controlled current paths and said second N- and P-transistors, an output terminal coupled to a node connecting said second N-transistor and said intermediate P-transistor, and an input terminal coupled to the gates of said second N- and P-transistors;

a clock terminal coupled to the gates of all of said intermediate N- and P-transistors for applying clock signals thereto; and wherein the input terminal of each of said inverters except the first one of said inverters is connected to the output terminal of the preceding one of said inverters;

the output of said last one of said standard inverters is coupled to the input terminal of the first one of said inverters;

a decoupling stage coupling the output of said last one of said standard inverters to an output terminal;

a shift-register having x stages, the input of said shift-register being coupled to the output terminal of the last one of said inverters;

a differentiating stage coupling the output of said shift register to the input terminal of the first one of said inverters;

the output of alternate ones of said standard inverters being coupled each by a capacitor to a respective output of said shift-register.

* * * * *